US008749245B2

(12) United States Patent
Koster

(10) Patent No.: US 8,749,245 B2
(45) Date of Patent: Jun. 10, 2014

(54) ION GAUGE, A MONITORING SYSTEM AND A METHOD FOR DETERMINING A TOTAL INTEGRATED CONCENTRATION OF SUBSTANCES HAVING SPECIFIC MOLECULAR WEIGHT IN A GAS SAMPLE

(75) Inventor: Norbertus Benedictus Koster, Delft (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 742 days.

(21) Appl. No.: 12/867,170

(22) PCT Filed: Feb. 13, 2009

(86) PCT No.: PCT/NL2009/050064
§ 371 (c)(1),
(2), (4) Date: Nov. 15, 2010

(87) PCT Pub. No.: WO2009/102204
PCT Pub. Date: Aug. 20, 2009

(65) Prior Publication Data
US 2011/0050242 A1     Mar. 3, 2011

(30) Foreign Application Priority Data
Feb. 15, 2008  (EP) .................................... 08151529

(51) Int. Cl.
G01N 27/62         (2006.01)
(52) U.S. Cl.
USPC ............ 324/464; 324/466; 324/468; 250/389
(58) Field of Classification Search
None
See application file for complete search history.

(56) References Cited

U.S. PATENT DOCUMENTS

| 5,281,915 | A | 1/1994 | Takahama et al. |
| 6,606,899 | B1 * | 8/2003 | Ketkar et al. ................. 73/31.02 |
| 6,670,624 | B1 | 12/2003 | Adams et al. |
| 7,449,685 | B2 * | 11/2008 | Takada et al. .................. 250/288 |
| 8,049,180 | B2 * | 11/2011 | Frosien et al. ............. 250/396 R |
| 2002/0036263 | A1 * | 3/2002 | Shiokawa et al. ............. 250/288 |
| 2006/0066824 | A1 | 3/2006 | Knappe et al. |

FOREIGN PATENT DOCUMENTS

| DE | G9103912.6 U1 | 5/1991 |
| EP | 1517186 A1 | 3/2005 |
| JP | 01-288762 A | 11/1989 |
| JP | 02-114441 | 4/1990 |
| JP | 05-005724 A | 1/1993 |
| JP | 9-324269 | 12/1997 |
| JP | 11-064287 A | 3/1999 |
| JP | 2004-157057 A | 6/2004 |
| JP | 2008-515232 | 8/2008 |
| JP | 2010-161366 A | 7/2010 |

* cited by examiner

Primary Examiner — Minh N Tang
(74) Attorney, Agent, or Firm — Hoffmann & Baron, LLP

(57) ABSTRACT

The invention relates to anion gauge for determining a total integrated concentration of a substance having a molecular weight falling into a pre-determined range of molecular weights in a gas sample. The anion gauge includes an ionization region in a vicinity of the ionization source; an accelerator for generating a flow of ionized molecules; a mass filter for intercepting the flow for separating ions having the molecular weight falling into the pre-determined range from the ionized molecules and a detector for generating a signal representative of the total integrated concentration of such ions present in the gas sample. The invention further relates to a lithographic apparatus and a method for determining a total integrated concentration of a substance having a molecular weight falling into a pre-determined range of molecular weights in a gas sample.

5 Claims, 3 Drawing Sheets

ION GAUGE, A MONITORING SYSTEM AND A METHOD FOR DETERMINING A TOTAL INTEGRATED CONCENTRATION OF SUBSTANCES HAVING SPECIFIC MOLECULAR WEIGHT IN A GAS SAMPLE This application is the U.S. National Phase of, and Applicant claims priority from, International Patent Application Number PCT/NL2009/050064 filed 13 Feb. 2009 and European Patent Application Number 08151529.8 filed 15 Feb. 2008, each of which are incorporated herein by reference.

FIELD OF THE INVENTION

The invention relates to an ion gauge for determining a total integrated concentration of substances having a specific molecular weight or a range of molecular weights in a gas sample. More particularly, the invention relates to an ion gauge for determining the total integrated concentration of a substance or substances having a high molecular weight.

The invention further relates to a monitoring system for monitoring a total integrated concentration of a substance or substances having a specific molecular weight in a gas sample.

The invention further relates to a method for determining a total integrated concentration of a substance or substances having specific molecular weight in a gas sample.

BACKGROUND OF THE INVENTION

An embodiment of a sensor for determining a presence of a substance in a gaseous sample is known from U.S. Pat. No. 5,281,915. The known sensor is arranged for analyzing an incoming gas flow for detecting a presence of a substance having a high molecular weight, for example a presence of a substance having molecular weight of about 100 or higher. For this purpose the known sensor is arranged with an ionization region arranged for producing ionized gas molecules, said ionization region comprising a radiation source disposed in a chamber arranged under atmospheric pressure, said chamber cooperating with a further region wherein the ionized oxygen and nitrogen molecules undergo secondary ionization to produce heavy ions. This further region is adapted with electrodes for inducing a potential difference in the region for allowing heavy ions to float towards a collector electrode whereat these ions recombine producing an electrical signal representative of the level of high molecular weight contamination in the inflowing gas. In order to ensure an adequate detection sensitivity of the high molecule contamination, the known sensor comprises a heater for heating the inflowing gas to a predetermined temperature.

It is a disadvantage of the known sensor that a two-step gas ionization is used, whereby a radioactive source is utilized for causing primary ionization of the light molecules. In addition, the known sensor is only operable under atmospheric pressure due to its design features, pertaining to an ion drift caused by the application of an external electric field. These operational conditions may cause an unallowable recombination rate of ions within the sensor influencing its accuracy. Next, in order to provide a sensible measurement the inflowing gas must be heated, which may limit application areas of such sensor.

SUMMARY OF THE INVENTION

It is an object of the invention to provide a sensor for determining a total integrated concentration of a substance having a specific molecular weight in a gas sample, which is robust, simple in design and has improved operational characteristics.

To this end an ion gauge according to the invention comprises:
ionization region for generating ionized molecules of the gas sample;
accelerator for generating a flow of said ionized molecules;
a mass filter for intercepting said flow for separating ions having the specific molecular weight falling within a pre-determined range from said ionized molecules;
a detector for generating a signal representative of the total integrated concentration of substances ions having the specific molecular weight present in the gas sample.

The invention is based on the insight that by using a mass filter to differentiate between ranges of molecular masses of species present in the gas sample, a total amount of species having specific, pre-determined molecular weight can be measured at once. It will be appreciated that the mass filter is used for filtering of species having unwanted molecular weight, for example having a molecular weight lower than a pre-determined threshold. By doing so the sensitivity of the ion gauge may be substantially increased. Such an increase of sensitivity is traded off by a loss in specificity, as different species meeting specific molecular weight criteria cannot be discriminated. However, such discrimination is not required in circumstances when an objective is to detect a mere presence or a mere concentration of a high molecular weight substance in a gas sample.

Such objective may find its origin in environmental, medical or industrial applications. In particular for lithographic apparatus operating at very short wavelengths or semiconductor production equipment it is required that the atmosphere of the apparatus is substantially free from heavy hydrocarbon compounds or heavy fluoride compounds. Based on continuous research it is found that a desirable partial pressure of these species in the lithographic apparatus is so low that it cannot be measured with conventional means. It must be noted that an operational pressure of a state of the art lithographic apparatus is in the order of a few Pa, which is too high for the most conventional means for measuring partial pressure of a species having high molecular weight.

The ion gauge according to the invention is compatible with operational requirements of lithographic machines, because it can be operated at pressures of a few Pa and because it does not require sophisticated controls. In its most simple embodiment the ion gauge according to the invention provides a trigger signal when the ion current measured post mass filter surpasses an allowable level. Alternatively, the ion gauge according to the invention may be arranged in a monitoring system for recording the results of the measurements of the contamination level and may be arranged to provide an enabling signal when the contamination level is allowable.

In an embodiment of the ion gauge according to the invention the ionization region comprises any one of the following: an electron generator, a photon generator or a plasma source for ionizing molecules of the gas sample.

For example, a known per se open or closed ion source can be realized by means of electron impact ionization. It may be preferable to locate such ion source in an evacuated chamber in order to increase lifetime of the filament of such source. It is found to be advantageous to ionize gas molecules using a single stage ionization scheme, because a controlled ionization rate of the heavy molecules of the gas sample can be achieved. Alternatively, the multi-photon ionization may be applied having an advantage of less generated heat with respect to the electron impact source. Finally, a per se known plasma source may be used to ionize gas molecules, which has an advantage that such ion source produces a high degree of ionization and is relatively robust.

Preferably, the mass filter comprises a magnetic field generator arranged to generate a magnetic field in a direction transverse to a flow direction of the ionized molecules for extracting ions having the specific molecular weight.

Several embodiments of a magnetic field generator are contemplated. First, it is possible to use a quadrupole mass spectrometer (QMS). An advantage of the quadrupole mass spectrometer is its detection limit for species having increased molecular weight being in the order of 1E-12 mbar partial pressure. The QMS may be arranged to generate an electro static field in a direction substantially perpendicular to a direction of flow of ions post acceleration. In the QMS due to the action of the electro static field the ions vibrate resulting in that solely ions having a specific molecular weight and charge can pass a suitable filter setting. The ions passing the filter are collected, for example by means of a Faraday cup and the resulting electric current is representative of the contamination level of the gas sample with high molecular weight species. In order to obtain a mass spectrum of the species in the gas sample it is possible to modify parameters of the filter thereby sampling ions having different mass.

Secondly, it is possible to use a magnetic sector analyzer which utilizes a principle that ions of different mass deflect differently under influence of an external magnetic field. A radius of a deflection trajectory is determined by strength of the external magnetic field, mass and the charge of the ion. In accordance with this principle in the ion gauge according to the invention the light ions can be deflected away from the detector whereas the heavy ions will be led into the detector. In other words, in this way a low mass cut-off filter can be realized. Due to the fact that the ion gauge according to the invention is conceived to detect a presence of trace elements, it is advantageous that substantially every ion having molecular weight above the cut-off level will be detected. This feature improves sensitivity of such ion gauge with regard to QMS-like sensors. Alternatively, it is possible to set the external magnetic field in such a way that ions having a pre-determined range of masses will reach the detector.

When the ions reach the mass filter post acceleration, they undergo mass separation. For example, when the sample is air, light ions of hydrogen, oxygen and nitrogen undergo the sharpest bend in the magnetic field and may be advantageously led to a conduit wherefrom they are removed from the ion gauge. In particular, due to the fact that gas composition of a lithographic apparatus comprises light elements like hydrogen, helium, nitrogen and argon, the conduit can be arranged to receive hydrogen the light atoms and to pump them away thereby reducing pressure in the ion gauge. This leads to a substantially molecular stream of the residual ions in the mass filter. The advantage of the molecular stream is that there are substantially no collisions between ions, leading to substantially undisturbed ion trajectories which terminate at a suitable charge collector.

It is noted that a maximum deflection angle of 180 degrees can be reached for hydrogen molecules. It is possible to provide a further conduit for receiving ions with masses between 4 and 130 atomic mass units, which may be preferably provided with a pump for extracting molecules and atoms from this conduit further relieving the ion gauge atmosphere. Finally, a sector for heavy molecules terminating in a charge collection device may be provided. The deflection radius for an ion is given by the formula:

$$R = \frac{1}{B}\sqrt{\frac{2mV}{q}},$$

wherein R is a deflection radius (m);
B is the strength of the magnetic field (T);
m is an ion mass (amu);
V is an acceleration voltage of the accelerator;
q is the ion charge.

Preferably, in the ion gauge according to the invention a Faraday cup or a secondary electron multiplier may be used as the detector. The Faraday cup is a most simple configuration of an ion detector, wherein the ions are collected on a target plate as an electrical current. A sensitivity of such detector is about 1E-13 mbar, which may be limited by availability of suitable amplification devices. In the secondary electron multiplier every ion is converted into an electron avalanche which is terminated on a target plate of a Faraday cup. The amplification factor of the secondary electron device may be about 1000 and for low pressures the amplification factor may be about 10.000. For purposes of detecting trace elements having high molecular weight, for example in a lithographic apparatus, it may be advantageous to use the secondary electron multiplier, because substantially every ion will be transformed into an individual electric pulse. Preferably, the secondary electron multiplier is provided with an additional amplification device thereby increasing a dynamic range of the ion gauge and substantially improving its sensitivity.

The monitoring system according to the invention comprises an ion gauge according to any one of the preceding claim.

The method for determining a total integrated concentration of substances having a molecular weight falling in a pre-determined range of molecular weights in a gas sample, according to the invention, comprises the steps of:
  ionizing gas molecules of the gas sample;
  accelerating the ionized molecules of the gas sample for generating a flow of ionized molecules;
  filtering ions having the molecular weight falling in the pre-determined range from said flow;
  generating a signal representative of the total integrated concentration of substances ions having the specific molecular weight present in the gas sample.

The method according to the invention may preferably further comprise the steps of:
  monitoring the total integrated concentration of the ions having the specific molecular weight in the gas sample;
  generating a trigger signal upon an event said level exceeds allowable level.

These and other aspects of the invention will be further discussed with reference to drawings. It will be appreciated that the drawings are presented for illustrative purposes only and may not be used to limit the scope of the appended claims.

DETAILED DESCRIPTION OF THE DRAWINGS

Figure 1:
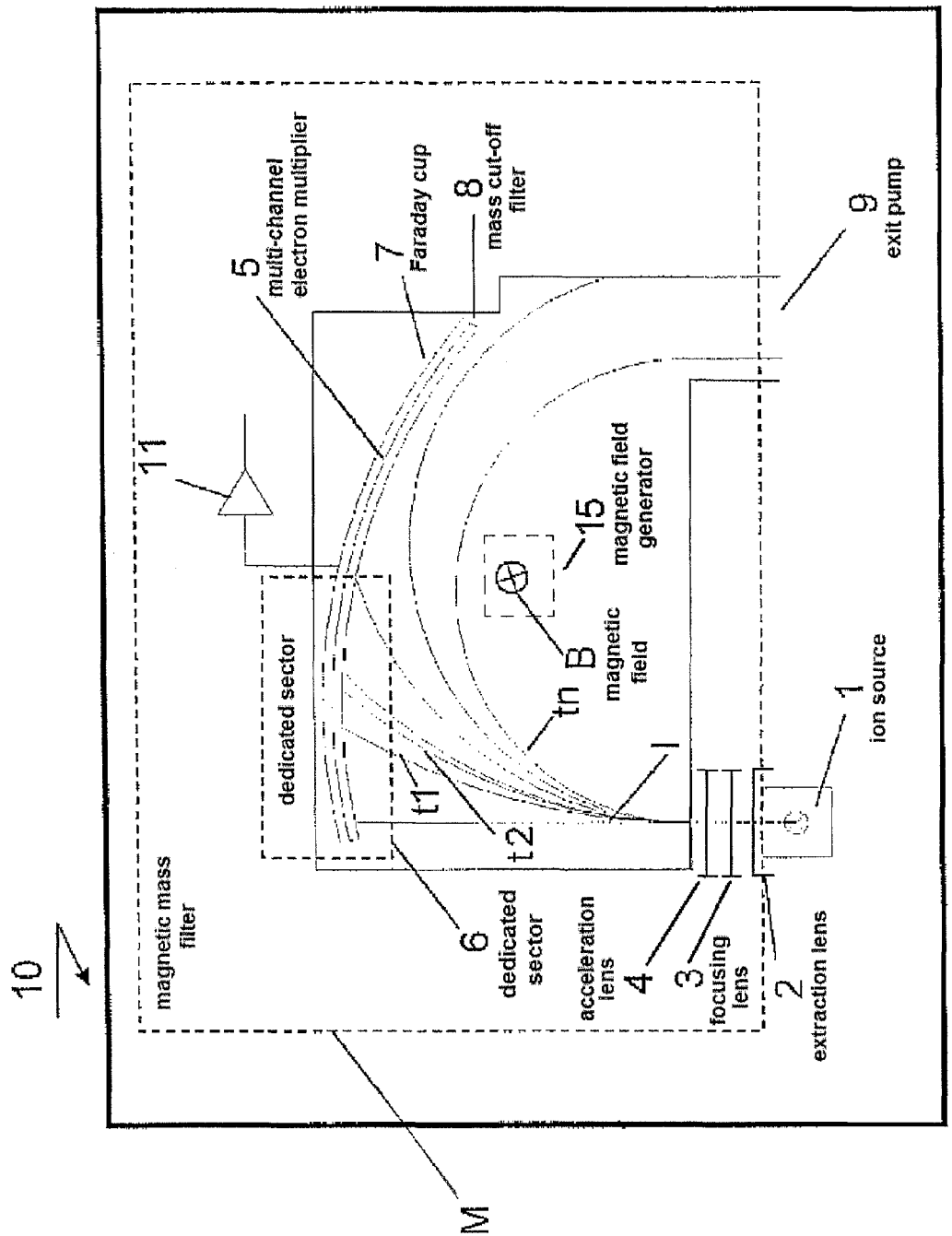
FIG. 1 presents in a schematic way an embodiment of the ion gauge according to the invention.

FIG. 1 presents in a schematic way an embodiment of the ion gauge according to the invention. The ion gauge 10 according to the invention may comprise a magnetic mass filter M, implemented, for example as a sector mass analyzer. The magnetic mass filter may be arranged cooperating with an ion source 1 arranged to cause ionization of gas molecules in a gas sample. For this purpose the gas sample may be provided as a flow in a region wherein the ion source 1 is adapted. Alternatively, the ion source may be arranged to ionize ambient gas, which may be advantageous when the ion gauge 10 according to the invention is provided in atmosphere of a lithographic apparatus.

The ion source 1 may be implemented as an open or a closed source of electrons which are conceived to ionize gas molecules using a one-stage ionization process, for example due to an electron impact ionization. Alternatively, the ionization source 1 may comprise a photon source for causing gas ionization pursuant to photon absorption. Still alternatively, the ionization source 1 may comprise a plasma source for ionizing gas molecules pursuant to secondary processes.

After the gas molecules are ionized they are accelerated using a suitable accelerator, which may be implemented as a suitable sequence of electron-optic devices, like extraction lens 2, focusing lens 3 and acceleration lens 4. A resulting beam of accelerated ions I is then subjected to a transverse magnetic field B leading to mass differentiation between light, intermediate and heavy ions due to different deflection trajectories t1, t2, . . . , to which are followed by the ions of different weights in the magnetic field B. The magnetic field B is generated by a magnetic field generator 15. Ions of light weight undergo the strongest deflection and may be collected by a suitable exit pump 9. In case when the ion gauge 10 is positioned in a light gas dominated atmosphere of a lithographic apparatus, the pump 9 will thus evacuate mostly light atoms thereby improving vacuum in the ion gauge, which is advantageous.

The heavy ions do not deflect considerably in the magnetic field B and may be collected in a dedicated sector 6 of the mass cut-off filter 8. The mass cut-off filter 8 is arranged to collect ions in a range of predetermined masses. In this case the sector 6 may be provided with a ranged of detection channels, corresponding to a range of pre-determined specified molecular weights. It is advantageous that a channel in such sector 6 is calibrated beforehand with respect to a molecular weight. In this case individual counts in detection channels can easily be converted into respective integrated concentrations of molecular contamination in the gas sample. The ion gauge 10 may comprise a multi-channel electron multiplier 5, which may be realized as a suitable plate. A detector, for example a Faraday cup 7 may be positioned beyond the multi-channel electron multiplier 5 to collect heavy ions and to provide a corresponding electric signal, which is representative to an amount of the heavy ions present in the sampled gas. The electric circuitry of the ion gauge 10 may advantageously comprise a suitable amplifier 11 for improving a signal to noise ratio.

It will be appreciated that sensitivity of the ion gauge 10 according to the invention may be determined by an ionization rate of the gas molecules, a transmission factor of the filter 8 and by sensitivity of the detector 7. When for illustrative purposes one takes a QMS with a same sensitivity as the ion gauge according to the invention, a transmission factor of the ion gauge according to the invention will be about 100 times higher due to the fact that all relevant ionized molecules pass the filter at the same time. Eventually, the detector 7 may be operated in an ion count mode instead of in a current mode, which will increase further sensitivity by a factor of ten. In order to reduce a dark current of the ion gauge according to the invention, the following measures may be undertaken reducing pressure inside the ion gauge, cooled electronics, multi stage pumping and mass separation. As a result a dark current of about 1E-17 mbar may be achieved.

Figure 2:
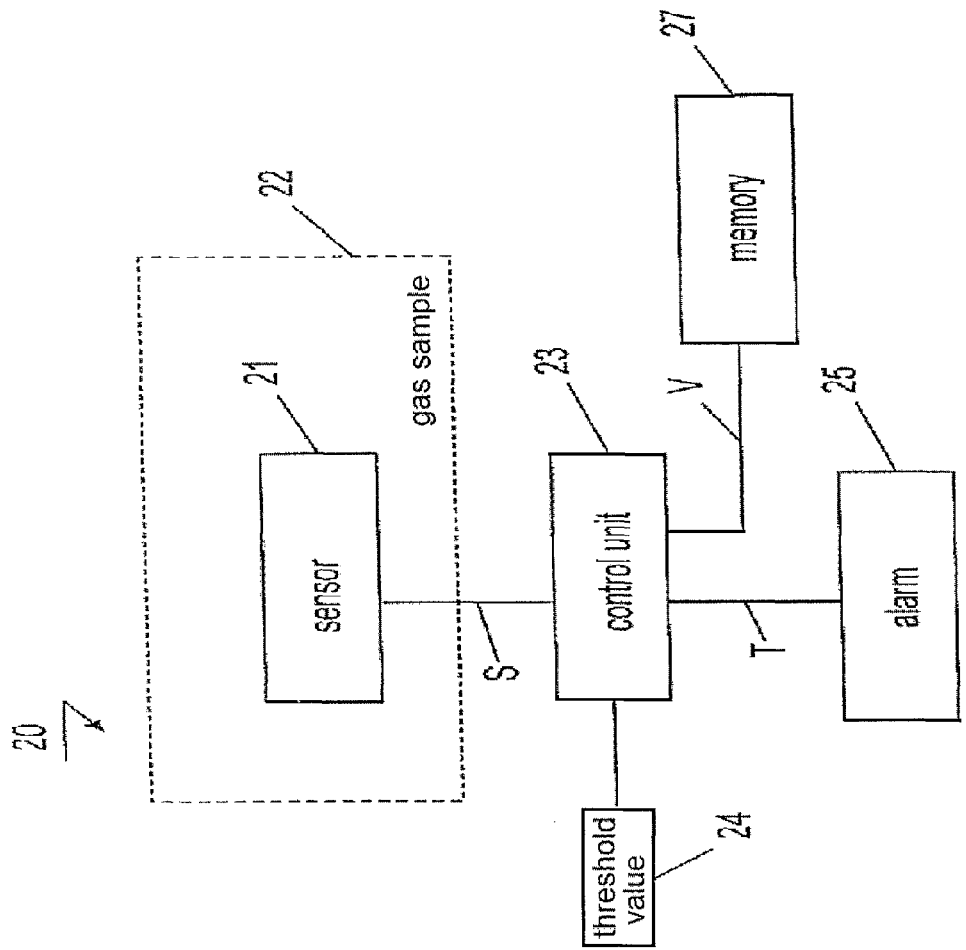
FIG. 2 present in a schematic way an embodiment of a monitoring system according to the invention.

FIG. 2 presents in a schematic way an embodiment of a monitoring system according to the invention. The monitoring system 20 according to the invention comprises an ion gauge 21 which may be arranged according to the principles set forth with reference to FIG. 1. The ion gauge 21 is preferably arranged to provide an electric signal S representative of amount of species having heavy weight in a gas sample 22, which has been analyzed by the ion gauge 21. It should be appreciated that the term gas sample may refer to a sample extracted from an atmosphere under investigation, or, alternatively, may refer to surrounding of the ion gauge. The latter is particularly the case when the ion gauge 21 is arranged for environmental studies, or when it is positioned inside a closed atmosphere, for example inside a lithographic apparatus.

The monitoring system according to the invention may further comprise a control unit 23 arranged to analyze the signal S. The control unit 23 may be arranged to record readings of a signal value V in a suitable way, for example a file may be created in a memory 27 of a computer. Alternatively or additionally, the control unit 23 may be arranged to compare a current value of the signal S with a pre-defined threshold value 24 and to produce a trigger signal T to alarm means 25 for warning purposes. In particular, when such monitoring system is arranged in a lithographic apparatus, the trigger signal may also be used to control operational conditions of the lithographic apparatus, like to accordingly control pumping means or to control source of radiation.

Figure 3:
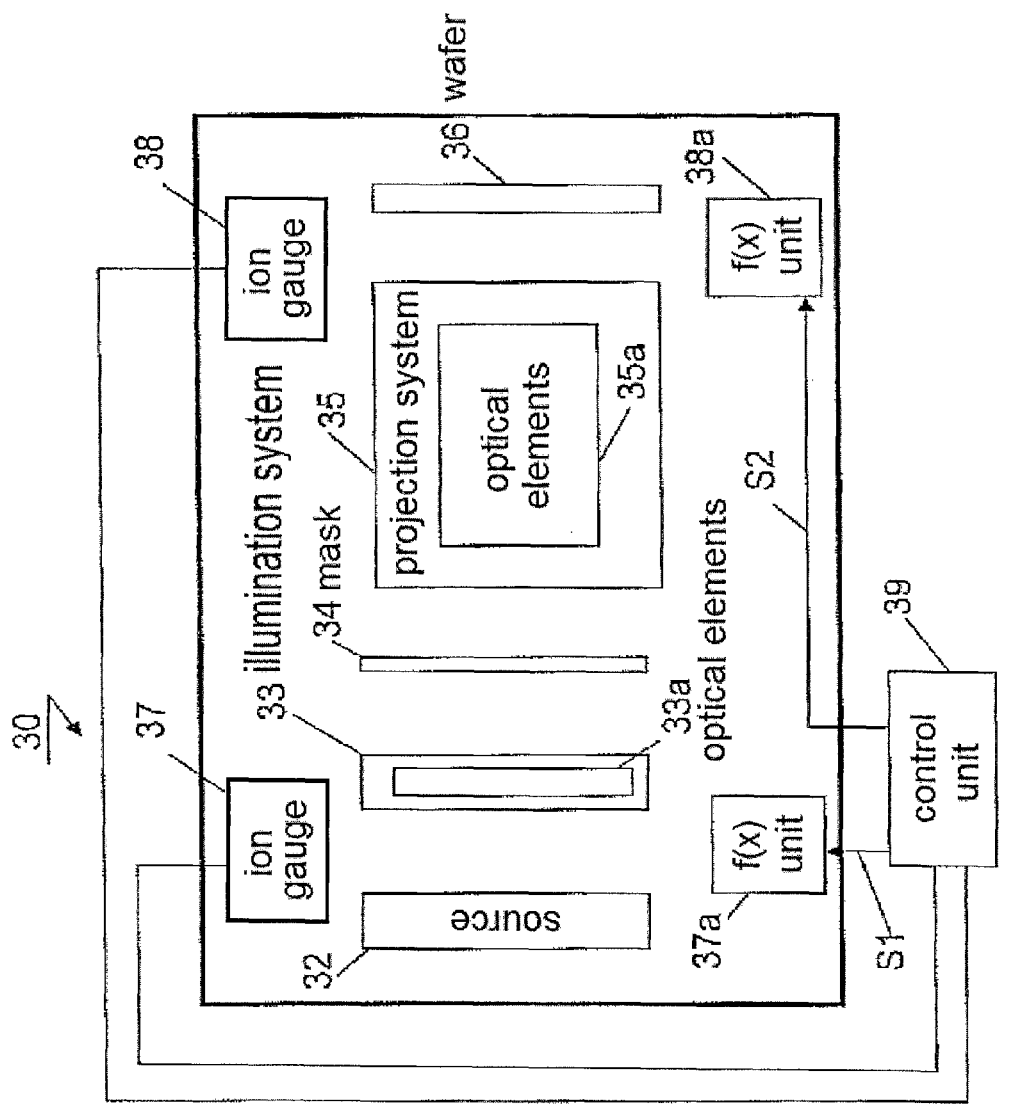
FIG. 3 presents in a schematic way an embodiment of a lithographic apparatus according to the invention.

FIG. 3 presents in a schematic way an embodiment of a lithographic apparatus according to the invention. A lithographic apparatus 30, as known in the art, may be used for applying a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate.

The lithographic apparatus 30 may comprise a source 32 arranged for generating a beam of suitable radiation to be subsequently used to pattern a substrate 36. Preferably, the source 32 is arranged to generate an extreme ultra-violet light with a wavelength between 5 and 20 nm. The generated beam of radiation is subsequently conditioned in the illumination system 33, which comprises a suitable plurality of optical elements 33a. After the beam of radiation is conditioned, it is patterned using a mask 34, which may be reflective or transmissive. The patterned beam of radiation enters the projection system, 35 comprising a further plurality of optical elements 35a for focusing the conditioned beam of radiation on the wafer 36. The wafer may be arranged to be displaceable using motors or contactless.

The atmosphere of the lithographic apparatus may comprise hydrogen, helium, nitrogen and argon. It is appreciated in the art that heavy molecules like heavy hydrocarbon compounds or heavy fluoride compounds, being contaminants in the atmosphere comprising light species, substantially deteriorate operational characteristics of the lithographic apparatus. In the lithographic apparatus according to the invention an ion gauge 37 or 38 may be positioned at regions where specific control of the atmosphere purity should be enabled.

First, such region may correspond to a region nearby the source of radiation 32. Alternatively, or additionally such region may relate to a region in a vicinity of a projection system, as contaminant compositions precipitating on the lenses of the optical elements 35a of the projection system 35 may substantially deteriorate patterning quality of the wafer 36. It will be appreciated that a suitable plurality of ion gauges may be arranged at a plurality of desirable control regions within the lithographic apparatus. Alternatively, it is possible that the ion gauges for detecting heavy molecular species are arranged externally to the casing of the lithographic apparatus 31 and that sample gas is conducted to the ion gauge using suitable gas conduits (not shown).

The lithographic apparatus 30 may further comprise a monitoring system as discussed with reference to FIG. 2. In this way, the ion gauges 37, 38 may be connected to the control unit 39 which may be adapted either to provide a trigger signal (not shown) upon an event the total integrated concentration of suitable species, for example species having heavy molecular weight in the atmosphere of the lithographic apparatus exceeds allowable limit, and/or to provide a control signal S1, S2 to suitable functional units (f(x)) 37a, 38a arranged to control environment at specific regions of the lithographic apparatus. Embodiments of such functional units are pumps, electric controls, or the like.

While specific embodiments have been described above, it will be appreciated that the invention may be practiced otherwise than as described. The descriptions above are intended to be illustrative, not limiting. It will be further appreciated that a term 'pre-determined range' may also relate to a situation when solely a threshold level is set. Thus, it will be apparent to one skilled in the art that modifications may be made to the invention as described in the foregoing without departing from the scope of the claims set out below.

The invention claimed is:

1. An ion gauge in a lithographic apparatus for determining a total integrated concentration of substances having a specific molecular weight in a gas sample, comprising:
   ionization region for generating ionized molecules of the gas sample;
   accelerator for generating a flow of said ionized molecules;
   a mass filter for intercepting said flow for separating ions having the specific molecular weight falling within a pre-determined range from said ionized molecules;
   a detector for generating a signal representative of the total integrated concentration of substances ions having the specific molecular weight present in the gas sample, including a secondary electron multiplier plate; and
   a control unit cooperating with the detector for generating a trigger signal upon an event, whereby said concentration exceeds a predetermined allowable level, so that the atmosphere of the apparatus is substantially free from heavy hydrocarbon compounds or heavy fluoride compounds.

2. An ion gauge according to claim 1, wherein the ionization region comprises any one of the following: an electron generator, a photon generator or a plasma source for ionizing molecules of the gas sample.

3. An ion gauge according to claim 1, wherein the mass filter comprises a magnetic field generator arranged to generate a magnetic field in a direction transverse to a flow direction of the ionized molecules.

4. An ion gauge according to claim 1 operable in reduced pressure conditions.

5. A monitoring system for monitoring a total integrated concentration of substances having a molecular weight falling in a pre-determined range in a gas sample, said system comprising an ion gauge according to claim 1.

* * * * *